(12) United States Patent
Nierle et al.

(10) Patent No.: US 7,385,872 B2
(45) Date of Patent: Jun. 10, 2008

(54) METHOD AND APPARATUS FOR INCREASING CLOCK FREQUENCY AND DATA RATE FOR SEMICONDUCTOR DEVICES

(75) Inventors: Klaus Nierle, Essex Junction, VT (US); KoonHee Lee, South Burlington, VT (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/581,350

(22) Filed: Oct. 17, 2006

(65) Prior Publication Data

US 2008/0089164 A1 Apr. 17, 2008

(51) Int. Cl.
*G11C 8/00* (2006.01)

(52) U.S. Cl. .................. 365/233; 365/189.05; 365/194; 365/198

(58) Field of Classification Search .......... 365/189.05, 365/194, 198, 233
See application file for complete search history.

(56) References Cited

U.S. PATENT DOCUMENTS

| | | | |
|---|---|---|---|
| 5,959,915 A | 9/1999 | Kwon et al. | |
| 6,199,185 B1 | 3/2001 | Ju et al. | |
| 6,304,104 B1* | 10/2001 | Hampel et al. | 326/52 |
| 6,845,478 B2 | 1/2005 | Luong | |
| 6,980,036 B2 | 12/2005 | Kwon et al. | |
| 2004/0090920 A1 | 5/2004 | Wang | |
| 2006/0085706 A1* | 4/2006 | Gearhardt | 714/724 |
| 2006/0117230 A1 | 6/2006 | Scipioni et al. | |
| 2006/0156126 A1 | 7/2006 | Oshima | |
| 2006/0163572 A1* | 7/2006 | Jeong et al. | 257/48 |
| 2007/0266286 A1* | 11/2007 | Tseng et al. | 714/731 |

* cited by examiner

*Primary Examiner*—Hoai V Ho
(74) *Attorney, Agent, or Firm*—Edell, Shapiro & Finnan, LLC (57) ABSTRACT

An embodiment of the present invention receives a data signal and at least one data shift signal that facilitates adjustment of the data signal and produces a resulting data signal with a data rate greater than a data rate of the data signal.

27 Claims, 5 Drawing Sheets

METHOD AND APPARATUS FOR INCREASING CLOCK FREQUENCY AND DATA RATE FOR SEMICONDUCTOR DEVICES

BACKGROUND

Semiconductor devices may be coupled to various external devices to perform certain functions. The external devices provide appropriate signals (e.g., clock signals, data signals, etc.) to enable the semiconductor device to operate. The operational frequency of the semiconductor devices are usually quite significant. However, certain circumstances may arise where the external device is incapable of providing clock signals at the operational frequency of the semiconductor device. For example, this may occur during testing of semiconductor devices. The testing is typically performed by a test platform that provides test signals to the semiconductor devices under test. The operational frequency of the semiconductor devices under test are usually quite significant. However, the maximum clock frequency attainable during the test is limited by the particular test platform being utilized, where the test platforms provide clock signals at frequencies below the operational frequencies of the devices under test. Thus, the semiconductor devices may be tested under conditions different than the device operational conditions.

In addition, other external devices or platforms (e.g., memory controller, etc.) coupled to the semiconductor devices may similarly provide clock signals at frequencies below the operational frequencies of the device, thereby degrading semiconductor device performance.

Attempts have been made to address the aforementioned problem. For example, a high speed platform may be utilized in conjunction with the semiconductor device. Further, hardware may be added to a platform to double the platform clock frequency, or a specific mode may be employed that doubles the external clock provided to the semiconductor devices.

However, these approaches suffer from several disadvantages. In particular, the high speed platforms tend to be extremely expensive and include limitations (e.g., with respect to parallel testing and signal integrity). Although the hardware and mode described above enable the clock frequency of the platform and external clock to be doubled, there is no mechanism to provide for doubling of the data rate. In other words, even though the clock frequency is increased, the data rate remains the same. For example, a test for a semiconductor memory device may include writing a toggling data sequence to memory (where the data toggles with each transition of a test system clock signal) in order to simulate stress on the device during operational conditions. Since the data or toggling rate is based on the test system clock frequency, the toggling rate of the data remains the same despite the increased clock frequency as described above, thereby providing incompatibility with the increased clock signal and insufficient coverage for the test.

SUMMARY OF THE INVENTION

Embodiments of the present invention include an apparatus having a data circuit to receive a data signal and at least one data shift signal that facilitates adjustment of the data signal. The data circuit combines the data signal and the data shift signal to produce a resulting data signal with a data rate greater than that of the data signal.

BRIEF DESCRIPTION OF THE DRAWINGS

The above and still further features and advantages of the present invention embodiments will become apparent upon consideration of the following detailed description of specific embodiments thereof, particularly when taken in conjunction with the accompanying drawings wherein like reference numerals in the various figures are utilized to designate like components.

DETAILED DESCRIPTION

Semiconductor devices may be coupled to and/or controlled by various external devices to perform certain functions, and include an operational frequency that is usually quite significant. However, certain circumstances may arise where the external device is incapable of providing signals at a rate compatible with the semiconductor device. For example, the external device may be incapable of providing clock signals at the operational frequency of the semiconductor device. Embodiments of the present invention increase the frequency, rate or other characteristics of signals received from the external device to enhance semiconductor device performance.

Figure 1A:
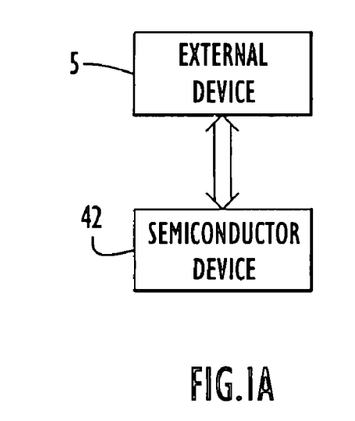
FIG. 1A is a diagrammatic illustration of an exemplary semiconductor system according to an embodiment of the present invention.

An exemplary semiconductor system according to an embodiment of the present invention is illustrated in FIG. 1A. In particular, the semiconductor system includes a semiconductor device 42 coupled to an external device 5. The external device provides various signals to the semiconductor device for operation. For example, the signals provided to semiconductor device 42 by external device 5 may include clock and data signals. The external device may be implemented by various types of devices (e.g., controller or control platform, test unit or platform, etc.). The semiconductor device includes circuitry that receives signals from the external device and produces internal signals with improved characteristics (e.g., frequency, data rate, etc.) to enhance semiconductor device performance. By way of example, the semiconductor device may receive clock signals from external device 5 and produce internal clock signals with a frequency greater than the frequency of the received clock signals. Similarly, the semiconductor device may receive data signals from the external device and produce data signals with a data rate greater than the data rate of the received data signals.

Figure 1B:
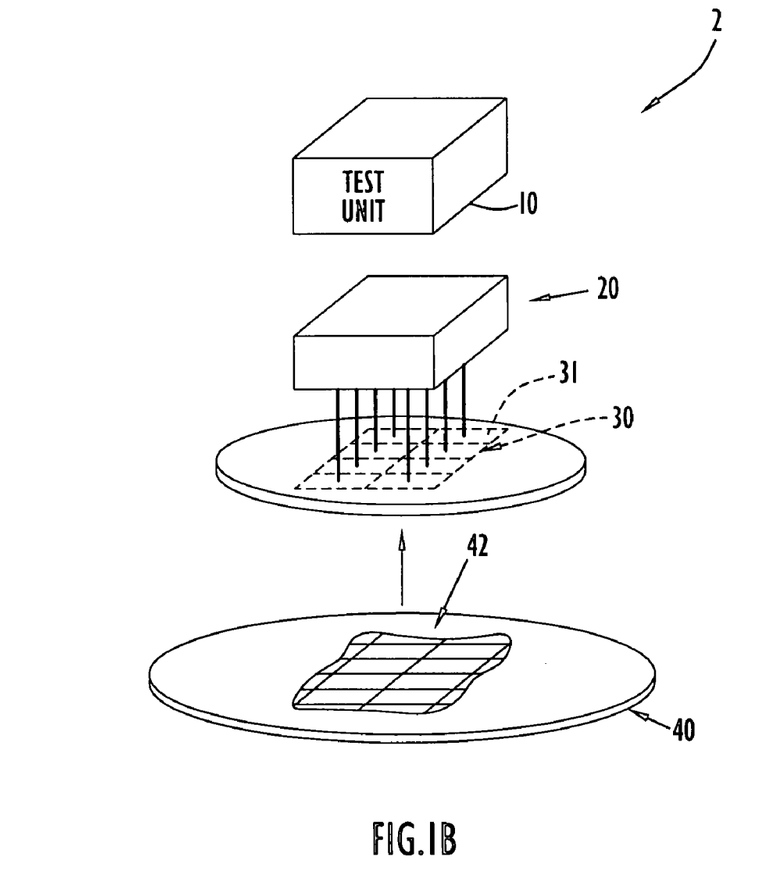
FIG. 1B is a diagrammatic illustration of an exemplary semiconductor system according to another embodiment of the present invention

An exemplary embodiment of the present invention in the form of a wafer test system is illustrated in FIG. 1B. In particular, wafer test system 2 includes a test unit 10, a connector and a probe card 30. The wafer test system may be implemented by any conventional wafer testing system or components. Test unit 10 is programmable and includes a processor to generate test patterns and appropriate signals, issue test mode commands and generally control testing. The test unit is coupled to probe card 30 via connector 20. The probe card includes a series of contact sets 31 for interfacing semiconductor devices 42 on a wafer 40 under test. The probe card enables transfer of signals between the semiconductor devices and test unit 10.

By way of example only, semiconductor devices 42 (FIGS. 1A and 1B) may be implemented by Double Data Rate (DDR) Dynamic Random Access Memory (DRAM) type semiconductor devices; however, the semiconductor devices may be of any device type (e.g., integrated circuits, logic, gates, etc.). This type of memory device (e.g., DDR DRAM) supports data transfers on the rising and falling edges of each clock cycle, thereby doubling the memory data throughput.

Figure 2A:
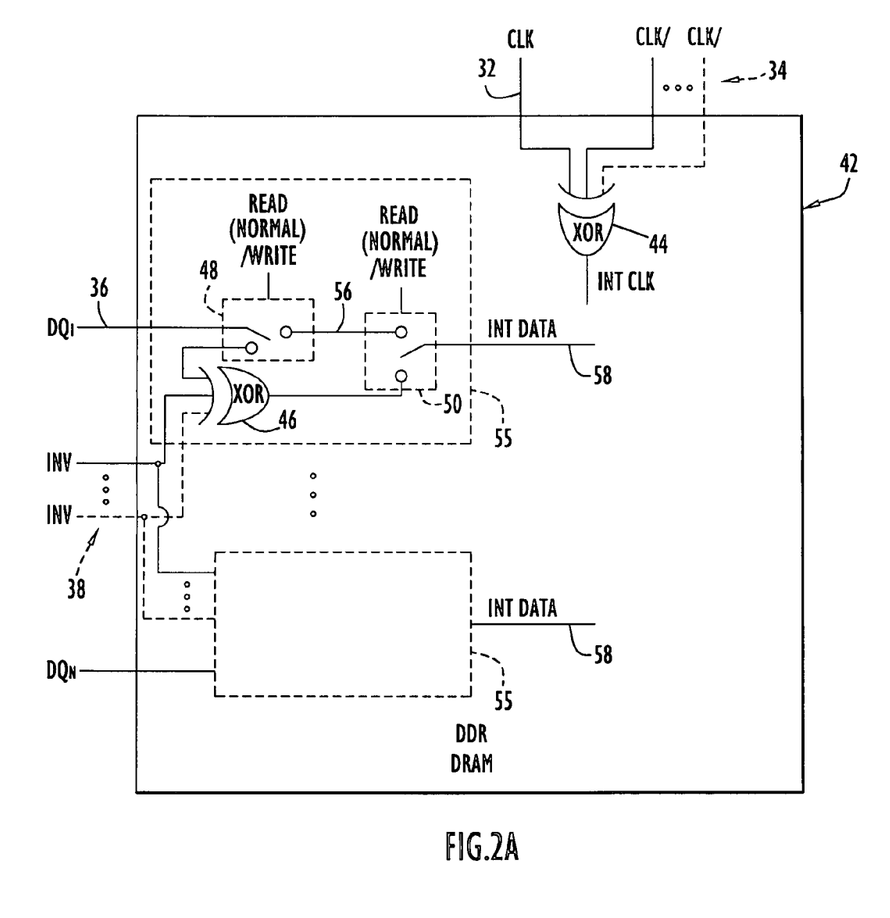
FIG. 2A is a schematic block diagram of an exemplary semiconductor device according to an embodiment of the present invention.

An exemplary semiconductor device 42 according to an embodiment of the present invention is illustrated in FIG. 2A. Initially, semiconductor device 42 includes a plurality of pads or pins for receiving various signals from external devices for operational and/or testing purposes. By way of example only, the pin or pad set includes a clock line 32 (e.g., CLK as viewed in FIG. 2A), a differential clock line 34 (e.g., CLK/ as viewed in FIG. 2A) and a plurality of data lines 36 (e.g., $DQ_1$-$DQ_N$ as viewed in FIG. 2A). The data lines are each coupled to a corresponding internal data line 58 that provides data to and receives data from the semiconductor device memory. The semiconductor device may include any quantity of pads or pins to accommodate various signals in accordance with a particular operation (e.g., address line, chip select line, etc.). Clock line 32 receives a clock signal from an external device to control and/or synchronize semiconductor device operations. Differential clock line 34 basically receives the external clock signal inverted or phase shifted by a predetermined offset. Data lines 36 serve as input/output (I/O) lines to transfer signals between the semiconductor device and test unit during testing or between the semiconductor device and external devices for operational modes. For example, the data lines may be utilized to receive data from the external device or test unit for placement in the semiconductor device or memory (e.g., in a write mode), and to provide data from the semiconductor device or memory to the external device or test unit (e.g., in a read mode).

Figure 3:
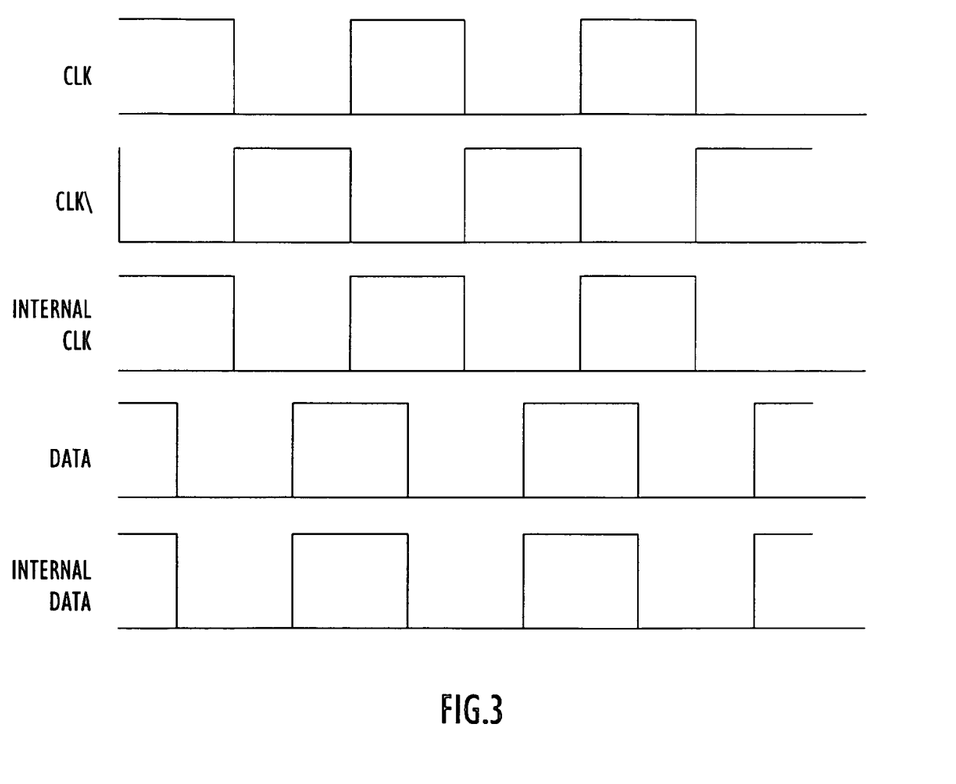
FIG. 3 are timing diagrams of clock and data signals.

Exemplary timing diagrams of signals utilized by semiconductor device 42 are illustrated in FIG. 3. Specifically, the timing diagrams illustrate signals on clock line 32 (e.g., CLK as viewed in FIG. 3), differential clock line 34 (e.g., CLK/ as viewed in FIG. 3) and one of the data lines 36 (e.g., DATA as viewed in FIG. 3), and further show the internal clock and data signals (e.g., INTERNAL CLK and INTERNAL DATA as viewed in FIG. 3). The internal signals are utilized by the semiconductor device to perform various operations. Basically, clock line 32 receives a clock signal from an external device, while the differential clock line receives a clock signal from the external device that is inverted (or phase shifted by approximately 180°) relative to the clock line signal. The internal clock signal (e.g., INTERNAL CLK) utilized by semiconductor device 42 mirrors (or is substantially the same as) the signal on clock line 32. The semiconductor device performs input/output operations (and other semiconductor device functions) based on the falling and/or rising edges (e.g., falling and rising edges for a DDR DRAM) of the internal clock signal. The data line receives data from the external device. For example, the data may be in the form of an alternating or toggling sequence of low and high level signals (e.g., 01010101, etc.) for a test environment. The rate of data within the pattern is comparable with the clock signal from the external device and forms the internal data signal (e.g., INTERNAL DATA). With respect to input/output operations, data can be written to the device from the internal data line in accordance with the edges of the clock signal, and may be read from the device to the data line based on the internal clock signals.

Embodiments of the present invention provide circuitry on the semiconductor device (e.g., VLSI silicon die, etc.) that receives signals from an external device and produces internal signals with enhanced characteristics to improve semiconductor device performance. For example, the circuitry may receive an external clock signal and data at a particular data rate and produce internal clock signals with an increased frequency and internal data signals with an enhanced data rate. This bypasses the need for expensive platforms or controllers (e.g., test platform, control platform, etc.) for use with the semiconductor device, and enables the semiconductor device to be used (or be compatible with) a wider range of external devices. When applied in a testing environment, the present invention embodiments maintain parallelism during testing and prevent test coverage exposure due to compromised testing which occurs in response to toggling data at lower frequencies, such as those provided by common test equipment. The present invention embodiments enable any desired data sequence to be produced and further provide critical testing of set-up and hold times as described below.

Referring back to FIG. 2A, in order to enhance characteristics of internal signals, the exemplary embodiment of the present invention includes logic circuitry placed on semiconductor device 42 to logically combine signals from the pins. By way of example, the embodiment increases the internal clock frequency and data rate of the internal data signals; however, any signals received from the external device may be enhanced by the semiconductor device in substantially the same manner described below. In particular, semiconductor device 42 further includes a data shift line 38 (e.g., INV as viewed in FIG. 2A), logic circuit 44 and data rate circuits 55. The logic and data rate circuits are preferably located adjacent physical pads of the semiconductor device. This enables the internal signal path to be stressed during test in a manner similar to that encountered under typical operating conditions. Clock line 32 (e.g., CLK as viewed in FIG. 2A) and differential clock line 34 (e.g., CLK/ as viewed in FIG. 2A) are coupled to respective inputs of logic circuit 44, in the form of an exclusive-OR circuit in this embodiment. Logic circuit 44 performs an exclusive-OR function to logically combine the clock and differential clock signals to produce the internal clock signal (e.g., INT CLK as viewed in FIG. 2A) utilized by semiconductor device 42. However, logic circuit 44 may be implemented by any suitable circuitry or other device (e.g., gate, IC or chip, processor, circuitry, etc.) and may perform any suitable logic function (e.g., AND, OR, NAND, NOR, etc.) to derive the internal clock signal.

Figure 4:
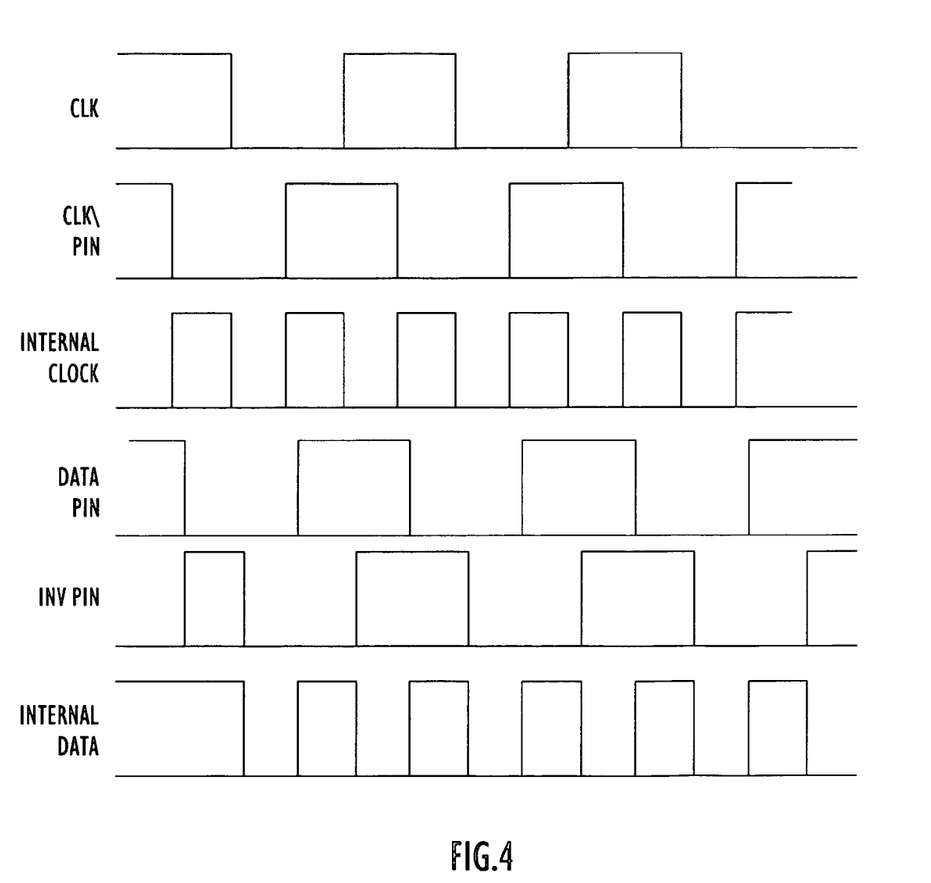
FIG. 4 are timing diagrams of clock and data signals received from an external device and resulting internal clock and data signals produced by an embodiment of the present invention.

Preferably, the clock signal is logically combined by logic circuit 44 with differential 11 clock line 34 providing the original clock signal shifted by approximately 90° to produce a resulting clock signal with a frequency increased by a factor of two. An exemplary timing diagram of the external and internal clock signals according to an embodiment of the present invention is illustrated in FIG. 4. Specifically, the timing diagrams illustrate signals on clock line 32 (e.g., CLK as viewed in FIG. 4), differential clock line 34 (e.g., CLK/ as viewed in FIG. 4), and the semiconductor device internal clock (e.g., INTERNAL CLOCK as viewed in FIG. 4). The internal clock signals are utilized by the semiconductor device to perform various operations. Basically, clock line 32 receives a clock signal from an external device, while the differential clock line receives the clock line signal phase shifted by approximately 90°. The internal clock signal (e.g., INTERNAL CLOCK as viewed in FIG. 4) utilized by semiconductor device 42 is produced by logic circuit 44 logically combining the clock (e.g., CLK) and phase shifted clock (e.g., CLK/) signals via an exclusive-OR operation as described above. The resulting internal clock signal (e.g., INTERNAL CLOCK) includes a frequency greater than that of the original or external clock signal by a factor of two as illustrated in FIG. 4.

Semiconductor device 42 may include additional pins or further utilize other available pins (e.g., Data Mask, DQS, etc.) as additional differential clock lines 34 (e.g., CLK/ as viewed in FIG. 2A). The additional lines receive the clock signal phase shifted by a predetermined offset and are coupled to the inputs of logic circuit 44. The use of additional differential clock lines at various phase offsets from the original clock signal enables the logic circuit to produce a resulting internal clock signal at an increased desired frequency (e.g., a frequency greater than that of the original clock signal by factors of three, four, etc.). For example, the clock signal may be logically combined by logic circuit 44 with two differential clock lines 34 respectively providing the original clock signal shifted by approximately 60° and 120° to produce a resulting clock signal with a frequency increased by a factor of three. Further, the clock signal may be logically combined by logic circuit 44 with three differential clock lines 34 respectively providing the original clock signal shifted by approximately 45°, 90° and 135° to produce a resulting clock signal with a frequency increased by a factor of four. Thus, semiconductor device 42 may be configured to attain any desired internal clock frequency, where the internal clock frequency is controlled by the quantity of differential clock lines and the corresponding phase offsets or shifts for the original clock signal.

The data rate of the data signals received from the external device may similarly be enhanced. Initially, semiconductor device 42 performs a read operation by retrieving desired data from the semiconductor device memory and placing the retrieved data on internal data lines 58 each associated with a corresponding data line 36 (e.g., $DQ_1$-$DQ_N$ as viewed in FIG. 2A). The retrieved data is subsequently placed on corresponding data lines 36 (e.g., $DQ_1$-$DQ_N$ as viewed in FIG. 2A) for transfer to an external device. The read or access rate of the semiconductor device is based on the frequency of the internal clock signal. Thus, increasing the frequency of the internal clock signal in the manner described above automatically increases the rate of the read operation.

However, with respect to the semiconductor device write operation, the data to be written into the semiconductor device memory is received on data lines 36 (e.g., $DQ_1$-$DQ_N$ as viewed in FIG. 2A) from an external device. This data includes a data rate based on the clock frequency of the external device that may be significantly less than the operational frequency of the semiconductor device. When applied to a testing environment, the data typically includes a toggling sequence as described above, where the rate of data toggling within the data waveform is based on the clock frequency of the external device (e.g., test unit 10), which is typically significantly less than that of the semiconductor device in an operational mode. Thus, merely increasing the frequency of the internal clock signal as described above is insufficient to enhance the data rate of the data signal.

In order to increase the data rate for the semiconductor device write operation, an embodiment of the present invention employs a data rate circuit 55 (FIG. 2A) for each semiconductor device data line (e.g., $DQ_1$-$DQ_N$ as viewed in FIG. 2A). The data rate circuit includes an arrangement similar to that described above for the clock signal. In particular, data rate circuit 55 includes logic circuit 46 and switching devices 48, 50. A data line 36 (e.g., $DQ_1$ as viewed in FIG. 2A) is coupled to corresponding internal data line 58 via switching devices 48, 50. The internal data line provides data to be written into the semiconductor device memory from data line 36 (e.g., $DQ_1$), and receives data retrieved from that memory for transfer to that data line. Data line 36 (e.g., $DQ_1$) is coupled to switching device 48. The switching device may be implemented by any suitable switching device (e.g., transistors, gates, logic, etc.) and may be controlled via a control signal. The control signal enables or disables the data rate enhancement (e.g., may indicate the type of operation being performed, such as read or write), and may be further utilized to configure the data rate circuit for varying semiconductor device modes. The control signal may be implemented by any signals received by semiconductor device 42 (e.g., those indicating the type of operation or mode). Switching device 48 is coupled to an input of logic circuit 46 and to a conductor 56, and basically directs data signals from data line 36 (e.g., $DQ_1$) to logic circuit 46, or from conductor 56 to data line 36 (e.g., $DQ_1$) in accordance with the control signal (e.g., type of operation or mode) as described below.

Switching device 50 is coupled to conductor 56 and the output of logic circuit 46 and basically directs data signals from logic circuit 46 to a corresponding internal data line 58, or from the internal data line to conductor 56 in accordance with the control signal (e.g., type of operation or mode) as described below. Switching device 50 may be implemented by any suitable switching device (e.g., transistors, gates, logic, etc.) and may be controlled by the control signal in substantially the same manner described above.

During a read operation, semiconductor device 42 retrieves desired data from the semiconductor device memory and places the retrieved data on corresponding internal data line 58. The desired data is conveyed from internal data line 58 to associated data line 36 (e.g., $DQ_1$) for transfer to an external device. In particular, the retrieved data is placed on internal data line 58, and switching device 50 couples the internal data line to conductor 56 in accordance with the control signal (e.g., indicating a read operation or a normal operational mode without data rate enhancement). Switching device 48 couples conductor 56 to data line 36 (e.g., $DQ_1$) in accordance with the control signal (e.g., indicating a read operation or normal operational mode without data rate enhancement) to enable transfer of the retrieved data to the external device. Since the data rate for a read operation is based on the internal clock signal as described above, the switching devices are controlled to enable retrieved data to be conveyed from internal data line 58 to data line 36 (e.g., $DQ_1$) (without the need to modify the data rate of the data signal). In addition, the switching devices are configured (e.g., to facilitate the supply of data line 36 (e.g., $DQ_1$) to corresponding internal data line 58) for normal operational modes of the semiconductor device to enable input/output operations without modification of the data rate of the data signal.

With respect to a write operation, the data rate of the data signal may be modified according to an embodiment of the present invention. In particular, data to be written to the semiconductor device memory is received on data line 36 (e.g., $DQ_1$). When applied to a testing environment, this data typically includes a toggling sequence with the data or toggling rate of data within the data waveform being significantly less than that of the semiconductor device in an operational mode. Switching device 48 couples data line 36 (e.g., $DQ_1$) to an input of logic circuit 46 in accordance with the control signal (e.g., indicating a write operation or enablement of the data rate enhancement). Data shift line 38 (e.g., INV as viewed in FIG. 2A) is similarly coupled to a corresponding input of logic circuit 46, preferably in the form of an exclusive-OR circuit. Logic circuit 46 performs an exclusive-OR function to logically combine the data and data shift signals to produce the internal data signal (e.g., INT DATA as viewed in FIG. 2A) utilized by semiconductor device 42. However, logic circuit 46 may be implemented by any suitable circuitry or other device (e.g., gate, IC or semiconductor device, processor, circuitry, etc.) and may perform any suitable logic function (e.g., AND, OR, NAND, NOR, etc.) to derive the internal data signal.

The data shift signal basically serves to enable logic circuit 46 to invert the data signal. Since logic circuit 46 performs an exclusive-OR operation to combine the data and data shift signals, a high level signal within the data shift signal enables the logic circuit to toggle or invert the data signal (e.g., an exclusive-OR operation logically combining a low level data signal and high level data shift signal produces a high level signal, while this operation logically combining a high level data signal and high level data shift signal produces a low level signal). By way of example, the data shift signal pulses may be phase shifted by approximately 90° relative to the data within the data signal. This produces a resulting internal data signal with a data rate increased by a factor of two relative to that of the data signal (FIG. 4).

The present invention embodiments may further test the set-up and/or hold times of the data relative to the clock. This is accomplished by controlling the data shift and/or data signals (e.g., adjusting the phase shift or waveforms). Since the point in time of toggling the data and/or data shift signals can be freely adjusted and determined (e.g., based on the data and/or data shift signals supplied to the semiconductor device), the set-up and/or hold times can be set to be more relaxed or stringent. Moreover, the duty cycle of the data shift signal (e.g., proportion of high level signals and low level signals within the waveform) may be adjusted to manipulate the internal data waveform and modify the set-up and/or hold times of the semiconductor device memory.

The resulting data signal from logic circuit 46 (FIG. 2A) is directed by switching device 50 to corresponding internal data line 58 for transfer to the semiconductor device memory. Thus, the switching devices may be configured to direct incoming data signals for placement in the semiconductor device memory (e.g., a write operation) to logic circuit 46 to adjust the data rate, while outgoing signals retrieved from the memory are directed by the switching devices to data lines 36 for transfer to an external device. The switching devices are further configured to couple the internal data line to a corresponding data line for normal operational modes (e.g., read and write operations without data rate enhancement).

Referring to FIG. 4, timing diagrams of exemplary signals for modifying the data rate according to an embodiment of the present invention include the signals on a data line 36 (e.g., $DQ_1$, DATA PIN as viewed in FIG. 4) and data shift line 38 (e.g., INV PIN as viewed in FIG. 4), and further show the semiconductor device internal data (e.g., INTERNAL DATA as viewed in FIG. 4). The internal data signals are utilized by the semiconductor device to perform various operations. Basically, data line 36 (e.g., $DQ_1$) receives a data signal from an external device. When applied in a testing environment, the data signal may include a toggling sequence as described above, where the toggling rate is comparable to the clock frequency of the external device, and the data shift line may receive a waveform phase shifted by approximately 90° relative to the data signal. The internal data signal (e.g., INTERNAL DATA as viewed in FIG. 4) utilized by semiconductor device 42 is produced by logic circuit 46 logically combining the data (e.g., DATA PIN) and phase shifted data (e.g., INV PIN) signals via an exclusive-OR operation as described above. In this case, the resulting internal data signal (e.g., INTERNAL DATA) includes a data rate greater than that of the original data signal by a factor of two and comparable with the increased internal clock frequency as illustrated in FIG. 4.

Each data rate circuit associated with a corresponding data line 36 may receive the same data shift signal as illustrated in FIG. 2A. This reduces the quantity of pins needed by a present invention embodiment of the semiconductor device. With respect to a testing environment, the data signal on each data line 36 typically includes an alternating or toggling sequence of data as described above. Since the data signals on each data line are toggling based on the same external device clock frequency, the data shift signal may be provided to each data rate circuit and be in the form of a series of pulses. The data shift signal is phase shifted relative to the data within the data signals (e.g., relative to the toggling of the data signals). This basically generates additional inversions or toggling of the data as described above and produces resulting internal data signals with increased data or toggling rates. This embodiment may be applied to any operational or other modes of the semiconductor device, where a global data shift signal may be employed.

Semiconductor device 42 (FIG. 2A) may include additional pins or further utilize other available pins (e.g., Data Mask, DQS, etc.) as additional data shift lines 38 (e.g., INV as viewed in FIG. 2A). The additional lines include waveforms phase shifted by a predetermined offset relative to the data signal and are coupled to the inputs of logic circuit 46. The use of additional data shift lines at various phase offsets enables the logic circuit to produce a resulting internal data signal with an increased data rate (e.g., data rate greater than that within the original data signal by factors of three, four, etc.). For example, the data signal may be logically combined by logic circuit 46 with two data shift lines 38 respectively providing signals shifted by approximately 60° and 120° relative to the data signal to produce a resulting internal data signal with a data rate increased by a factor of three. Further, the data signal may be logically combined by logic circuit 46 with three data shift lines 38 respectively phase shifted by approximately 45°, 90° and 135° relative to the data signal to produce a resulting internal data signal with a data rate increased by a factor of four. Thus, semiconductor device 42 may be configured to attain any desired data rate, where the data rate is controlled by the quantity of data shift lines and the corresponding phase offsets or shifts. The above arrangement for data line 36 (e.g., $DQ_1$) is applied to each data line (e.g., $DQ_1$-$DQ_N$) of the semiconductor device in substantially the same manner described above.

Figure 2B:
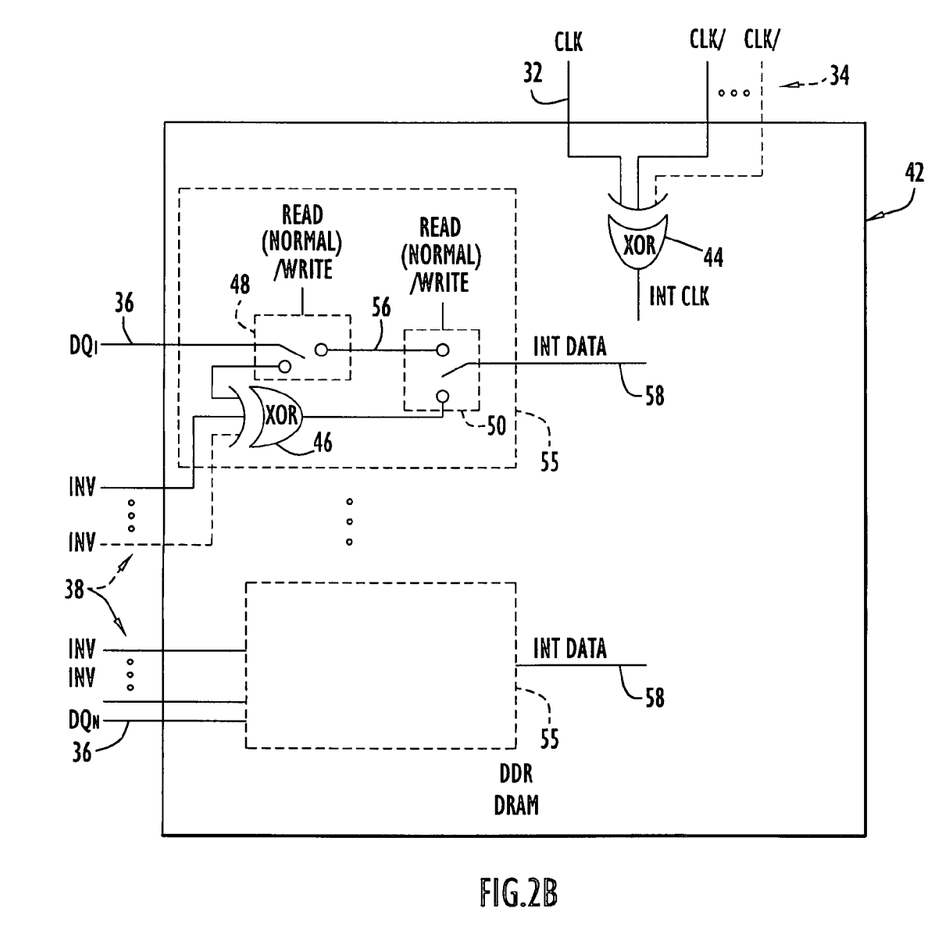
FIG. 2B is a schematic block diagram of an exemplary semiconductor device according to another embodiment of the present invention.

Alternatively, each data rate circuit may be associated with a corresponding data shift signal as illustrated by another embodiment of the present invention in FIG. 2B. Initially, semiconductor device 42 is substantially similar to the semiconductor device described above for FIG. 2A and includes one or more data shift signal lines 38 associated with a corresponding data rate circuit 55. In this case, the external device may provide separate data and data shift signals to each data rate circuit to enhance the data rate of any desired data sequence. The data shift and data signals for each data rate circuit may be generated to produce, via a corresponding logic circuit 46, any desired internal data sequence (e.g., alternating or non-alternating data sequences) with increased data rates in substantially the same manner described above. The data and data shift lines for each data rate circuit may include any suitable waveforms to produce the desired internal data signal via a corresponding logic circuit 46. The enhanced data rate effectively provides for a parallel write operation and increases the data throughput of the semiconductor device. For example, doubling the data rate and clock frequency as described above enables a semiconductor device with sixteen data lines 36 to perform a parallel write operation and function as a device with thirty-two data lines 36.

Semiconductor device 42 (FIG. 2B) may include additional pins or further utilize other available pins (e.g., Data Mask, DQS, etc.) as additional data shift lines 38 (e.g., INV as viewed in FIG. 2B) for each data rate circuit 55. The additional lines associated with a corresponding data line 36 each include waveforms and are coupled to the inputs of logic circuit 46 of a corresponding data rate circuit 55. The data shift and data signals for each data rate circuit may be generated to produce, via a corresponding logic circuit 46, any desired internal data sequence (e.g., alternating or non-alternating data sequences) with increased data rates (e.g., data rates greater than that within the original data signal by factors of three, four, etc.) in substantially the same manner described above. The data and data shift lines for each data rate circuit may include any suitable waveforms to produce the desired internal data signal via a corresponding logic circuit 46. Thus, semiconductor device 42 may be configured to attain any desired data rate, where the data rate is controlled by the quantity of data shift lines and the data and/or data shift signals. The above arrangement for data line 36 (e.g., DQ$_1$) is applied to each data line (e.g., DQ$_1$-DQ$_N$) of the semiconductor device in substantially the same manner described above.

The embodiments of the present invention enable a semiconductor device to produce enhanced internal signals and effectively create a new interface for these devices for any testing or operational purposes. The degree of enhancement may be regulated to control operational performance of the semiconductor device for optimal conditions and/or for compatibility with external devices.

It will be appreciated that the embodiments described above and illustrated in the drawings represent only a few of the many ways of implementing a method and apparatus for increasing clock frequency and data rate for semiconductor devices.

The present invention embodiments may be utilized with any desired types of semiconductor devices (e.g., memory, integrated circuits, gates, etc.), test systems and/or wafers of any desired materials (e.g., various semi-conductor materials (e.g., silicon, etc.), etc.). The test systems may test components or circuits at any desired stages (e.g., wafers, packaged components, boards, etc.). For example, the present invention embodiments may be used to test circuits or individual circuit components to increase the internal clock frequency and data rate. The wafers may include any quantity of semiconductor devices arranged in any fashion.

The wafer test system may be implemented by any conventional or other wafer test systems and/or components (e.g., test unit, probe card, connector, etc.). The test unit may be implemented by any conventional or other test unit and is preferably programmable. The test unit may include any conventional or other microprocessor, controller, circuitry and/or software modules to perform and evaluate any types of desired tests (e.g., transmit any desired commands and test data, receive and analyze test results, etc.). The test unit may perform any quantity of any suitable tests and may receive and evaluate test results from the semiconductor devices based on any desired criteria or thresholds.

The wafer test system may include any quantity of probe cards each enabling engagement with any quantity of semiconductor devices on a wafer. The probe card may be implemented by any conventional or other interface (e.g., circuitry, connectors, contacts, etc.) to enable transfer of signals between the probe card and test unit. The probe card may include any quantity of contact sets each including any quantity of contacts to interface any quantity of semiconductor devices or semiconductor device lines for parallel testing of any quantity of semiconductor devices. The connector may be implemented by any conventional or other connector to enable transference of signals between the probe card and test unit.

The semiconductor devices may be of any type (e.g., memory, integrated circuits, etc.) and include any quantity of any types of lines or pins (e.g., command, chip select, address, I/O, clock, data or DQ, data mask, DQS, etc.) arranged in any fashion. The lines or pins may include any desired capacity, and may accommodate any type and quantity of signals (e.g., bits, etc.). The semiconductor device may be implemented by any type of memory device (e.g., DRAM, SRAM, etc.) and include any suitable memory array to store data.

The various test signals (e.g., data, control signal, clock, differential clock, data shift, etc.) may be provided to the semiconductor devices over any desired lines, pins and/or pads in any desired fashion. The signals may be in any form and include any suitable characteristics (e.g., frequency, logic levels, potentials, etc.). The labels for the various signals and pins (e.g., CLK, CLK/, DQ, INV, etc.) are merely exemplary and used for reference purposes to describe the present invention embodiments. The signals and/or pins may be labeled in any desired fashion. The data pattern (e.g., for data written to the semiconductor device) may utilize any desired format and may be of any desired length. The control signal may be provided by the external device, or may be implemented or derived from any other semiconductor device signal, preferably indicating the type of operation or mode (e.g., read, write, test, etc.). The control signal may include any desired values to control the switching devices in any fashion.

The circuitry of the present invention embodiments may be disposed on the semiconductor device at any suitable location and arranged in any fashion. The logic circuits may be implemented by any suitable circuitry or other devices (e.g., gate, IC or chip, processor, circuitry, etc.) and may perform any suitable logic (e.g., AND, OR, NAND, NOR, etc.) or other function to derive the internal signals with an increased clock frequency and/or data rate. The logic circuits may include any quantity of inputs and provide any quantity of outputs. The semiconductor device may include any quantity of additional lines or utilize any quantity of existing or available lines, each including or redefined to include the clock signal phase shifted by any suitable amount, to enable adjustment of the internal clock signal to any desired frequency.

The data rate circuit may include any quantity of any conventional or other components (e.g., switches, logic, etc.) arranged in any fashion to generate the internal data signals and facilitate data transfer for input/output operations. The data rate circuits may accommodate any quantity of data and internal data lines. The switching devices may be implemented by any suitable switching device (e.g., transistors, gates, logic, multiplexers, demultiplexers, etc.) and may be controlled via any suitable control signal. The semiconductor device may include any quantity of additional lines or utilize any quantity of existing or available lines, each including or redefined to include a data shift signal (e.g., phase shifted by any suitable amount relative to data within the data signal or generated in any other fashion), to enable adjustment of the internal data signal to any desired data rate. Further, the data shift signal may be adjusted in any fashion and/or include any desired duty cycle to control the set-up and hold times of the semiconductor device memory. The data shift lines may be global or, alternatively, each data line may receive an individual data shift signal.

The data shift signal may include any suitable characteristics to accommodate various data patterns. For example, the data shift signal may be generated to produce toggling for plural bits within the data signal (e.g., trigger additional toggling for data patterns having toggling of every two, three or more bits (e.g., 00110011)) or non-alternating data patterns.

The present invention embodiments are not limited to the applications described herein, but may be applied to any testing or operational environment to increase the clock frequency and/or data rate of any suitable internal signals for devices. Further, generation of the enhanced internal clock and data signals of the present invention embodiments may be employed either individually (e.g., generation of the enhanced internal clock signals may be employed with or without generation of the enhanced internal data signals, generation of the enhanced internal data signals may be employed with or without generation of the enhanced internal clock signals, etc.) or in any combination.

From the foregoing description, it will be appreciated that the invention makes available a novel method and apparatus for increasing clock frequency and data rate for semiconductor devices, wherein circuitry on a semiconductor device or die receives an external clock signal and data at a particular data rate and produces internal clock signals with an increased frequency and internal data signals with an enhanced data rate.

Having described preferred embodiments of a new and improved method and apparatus for increasing clock frequency and data rate for semiconductor devices, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An apparatus for enhancing a data rate of a data signal including a data pattern for storage in a memory device comprising:
   a data circuit to receive at least one data shift signal and a data signal including a data pattern for storage in a memory device and a first data rate associated with a first clock signal frequency, and to produce a resulting data signal including a second data rate associated with a second clock signal frequency, wherein each said data shift signal includes a phase shifted version of said data signal and said second clock signal frequency and said second data rate are respectively greater than said first clock signal frequency and said first data rate, and wherein said data circuit includes a data logic circuit to combine said data and data shift signals to produce said resulting data signal with said data pattern for storage in said memory device.

2. The apparatus of claim 1 further comprising:
   a clock circuit to receive a clock signal with said first clock signal frequency and at least one differential signal phase shifted relative to said clock signal and to produce a resulting clock signal with said second clock signal frequency by combining said clock and differential signals to enable storage of said data pattern of said resulting data signal by said memory device.

3. The apparatus of claim 1, wherein said data logic circuit comprises:
   a logic circuit to perform an exclusive-OR operation of said data signal and said at least one data shift signal to produce said resulting data signal.

4. The apparatus of claim 2, wherein said clock circuit comprises:
   a logic circuit to perform an exclusive-OR operation of said clock signal and said at least one differential signal to produce said resulting clock signal.

5. The apparatus of claim 2, wherein:
   said at least one data shift signal comprises a signal phase shifted by ninety degrees relative to said data signal to produce said resulting data signal with said second data rate twice that of said first data rate; and
   said at least one differential signal comprises a signal phase shifted by ninety degrees relative to said clock signal to produce said resulting clock signal with said second clock signal frequency twice that of said first clock signal frequency.

6. The apparatus of claim 2, wherein said apparatus comprises a memory device comprising a plurality of said data circuits, and at least one data line, wherein said data circuits and said clock circuit are disposed on said memory device with each data circuit associated with a corresponding data line of said memory device, and wherein said clock signal, said at least one differential signal, said data signal and said at least one data shift signal are received from an external device to produce said resulting clock and data signals.

7. The apparatus of claim 6, wherein at least one of said data signal and said data shift signal is adjusted to control set-up and hold times of said memory device.

8. An apparatus for enhancing a data rate of a data signal including a data pattern for storage in a memory device comprising:
   data signal means for receiving at least one data shift signal and a data signal including a data pattern for storage in a memory device and a first data rate associated with a first clock signal frequency, wherein each said data shift signal includes a phase shifted version of said data signal; and
   data means for logically combining said data signal and said at least one data shift signal to produce a resulting data signal including a second data rate associated with a second clock signal frequency and said data pattern for storage in said memory device, wherein said second clock signal frequency and said second data rate are respectively greater said first clock signal frequency and said first data rate.

9. The apparatus of claim 8 further comprising:
clock signal means for receiving a clock signal with said first clock signal frequency and at least one differential signal phase shifted relative to said clock signal; and
clock means for producing a resulting clock signal with said second clock signal frequency by combining said clock and differential signals to enable storage of said data pattern of said resulting data signal by said memory device.

10. The apparatus of claim 8, wherein said data means comprises:
logic means for performing an exclusive-OR operation of said data signal and said at least one data shift signal to produce said resulting data signal.

11. The apparatus of claim 9, wherein said clock means comprises:
logic means for performing an exclusive-OR operation of said clock signal and said at least one differential signal to produce said resulting clock signal.

12. The apparatus of claim 9, wherein:
said at least one data shift signal comprises a signal phase shifted by ninety degrees relative to said data signal to produce said resulting data signal with said second data rate twice that of said first data rate; and
said at least one differential signal comprises a signal phase shifted by ninety degrees relative to said clock signal to produce said resulting clock signal with said second clock signal frequency twice that of said first clock signal frequency.

13. The apparatus of claim 9, wherein said apparatus comprises a memory device comprising a plurality of said data signal means and said data means, and at least one data line, wherein said plurality of data signal means, said plurality of data means, said clock signal means and said clock means are disposed on said memory device with each data signal means and data means associated with a corresponding data line of said memory device, and wherein said clock signal, said at least one differential signal, said data signal and said at least one data shift signal are received from an external device to produce said resulting clock and data signals.

14. A memory device for enhancing a data rate of a data signal including a data pattern for storage in said memory device comprising:
a plurality of clock lines to receive a clock signal including a first clock signal frequency and at least one differential clock signal phase shifted relative to said clock signal;
at least one data line to receive a data signal including a first data rate associated with said first clock signal frequency and a data pattern for storage in said memory device;
at least one data shift line to receive at least one data shift signal each including a phase shifted version of said data signal; and
at least one data circuit, associated with said at least one data line, to receive said data signal and said at least one data shift signal and to combine said data and data shift signals to produce a resulting data signal including a second data rate associated with a second clock signal frequency and said data pattern for storage in said memory device, wherein said second clock signal frequency and said second data rate are respectively greater than said first clock signal frequency and said first data rate.

15. The memory device of claim 14 further comprising:
a clock circuit to receive said clock signal and said at least one differential signal and produce a resulting clock signal with said second clock signal frequency by combining said clock and differential signals to enable storage of said data pattern of said resulting data signal by said memory device.

16. The memory device of claim 14, wherein said data circuit comprises:
a logic circuit to perform an exclusive-OR operation of said received data signal and said at least one data shift signal to produce said resulting data signal.

17. The memory device of claim 15, wherein said clock circuit comprises:
a logic circuit to perform an exclusive-OR operation of said clock signal and said at least one differential signal to produce said resulting clock signal.

18. The memory device of claim 15, wherein said at least one data shift signal comprises a signal phase shifted by ninety degrees relative to said data signal to produce said resulting data signal with said second data rate twice that of said first data rate.

19. The memory device of claim 14, wherein said clock signal, said at least one differential signal, said data signal and said at least one data shift signal are received from an external device to produce said resulting clock and data signals.

20. The memory device of claim 14, wherein at least one of said data signal and said data shift signal is adjusted to control set-up and hold times of said memory device.

21. A method of enhancing a data rate of a data signal including a data pattern for storage in a memory device comprising:
(a) receiving at least one data shift signal and a data signal including a data pattern for storage in a memory device and a first data rate associated with a first clock signal frequency, wherein each said data shift signal includes a phase shifted version of said data signal; and
(b) producing a resulting data signal including a second data rate associated with a second clock signal frequency and said data pattern for storage in said memory device by combining said data and data shift signals, wherein said second clock signal frequency and said second data rate are respectively greater than said first clock signal frequency and said first data rate.

22. The method of claim 21 further comprising:
(c) receiving a clock signal and at least one differential signal phase shifted relative to said clock signal; and
(d) producing a resulting clock signal with said second clock signal frequency by combining said clock and differential signals to enable storage of said data pattern of said resulting data signal by said memory device.

23. The method of claim 21, wherein step (b) further comprises:
(b.1) performing an exclusive-OR operation of said data signal and said at least one data shift signal to produce said resulting data signal.

24. The method of claim 22, wherein step (d) further comprises:
(d.1) performing an exclusive-OR operation of said clock signal and said at least one differential signal to produce said resulting clock signal.

25. The method of claim 22, wherein step (a) further comprises:
- (a.1) receiving said at least one data shift signal comprising a signal phase shifted by ninety degrees relative to said data signal;

step (b) further comprises:
- (b.1) producing said resulting data signal with said second data rate twice that of said first data rate;

step (c) further comprises:
- (c.1) receiving said at least one differential signal comprising a signal phase shifted by ninety degrees relative to said clock signal; and step (d) further comprises:
- (d.1) producing said resulting clock signal with said second clock signal frequency twice that of said first clock signal frequency.

26. The method of claim 22, wherein said device comprises a memory device, and step (a) further includes:
- (a.1) receiving said data signal and said at least one data shift signal from an external device;

step (b) further includes:
- (b.1) producing said resulting data signal;

step (c) further includes:
- (c.1) receiving said clock signal and said at least one differential signal from said external device; and step (d) further includes:
- (d.1) producing said resulting clock signal.

27. The method of claim 26, wherein step (a) further includes:
- (a.2) adjusting at least one of said data signal and said data shift signal to control set-up and hold times of said memory device.

* * * * *